(12) United States Patent
Gao et al.

(10) Patent No.: US 11,399,150 B2
(45) Date of Patent: Jul. 26, 2022

(54) AUTO-ZERO TECHNIQUES FOR LATERAL OVERFLOW INTEGRATING CAPACITOR (LOFIC) READOUT IMAGE SENSOR

(71) Applicant: OMNIVISION TECHNOLOGIES, INC., Santa Clara, CA (US)

(72) Inventors: Zhe Gao, San Jose, CA (US); Tiejun Dai, Santa Clara, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 77 days.

(21) Appl. No.: 17/098,230

(22) Filed: Nov. 13, 2020

(65) Prior Publication Data

US 2022/0159206 A1    May 19, 2022

(51) Int. Cl.
| | |
|---|---|
| *H04N 5/378* | (2011.01) |
| *H04N 5/363* | (2011.01) |
| *H04N 5/374* | (2011.01) |
| *H01L 27/146* | (2006.01) |
| *H03M 1/56* | (2006.01) |
| *H04N 5/3745* | (2011.01) |

(52) U.S. Cl.
CPC ....... *H04N 5/378* (2013.01); *H01L 27/14612* (2013.01); *H01L 27/14643* (2013.01); *H03M 1/56* (2013.01); *H04N 5/363* (2013.01); *H04N 5/37457* (2013.01)

(58) Field of Classification Search
CPC ...... H04N 5/378; H04N 5/363; H04N 5/3745; H01L 27/14612; H01L 27/14643
See application file for complete search history.

(56) References Cited

U.S. PATENT DOCUMENTS

| | | | | |
|---|---|---|---|---|
| 11,140,352 | B1* | 10/2021 | Dai | ........................ H04N 5/378 |
| 2017/0054931 | A1* | 2/2017 | Wang | ..................... H04N 5/378 |
| 2017/0289475 | A1* | 10/2017 | Ha | ........................ H04N 5/3745 |
| 2020/0260034 | A1* | 8/2020 | Moue | ..................... H04N 5/378 |
| 2021/0377434 | A1* | 12/2021 | Dai | ..................... H04N 5/3575 |
| 2022/0013551 | A1* | 1/2022 | Mun | ..................... H01L 27/146 |

FOREIGN PATENT DOCUMENTS

WO    WO 2005/057903 A2    6/2005

* cited by examiner

*Primary Examiner* — Marly S Camargo
(74) *Attorney, Agent, or Firm* — Christensen O'Connor Johnson Kindness PLLC

(57) ABSTRACT

Switching techniques for fast voltage settling in image sensors are described. In one embodiment, an image sensor includes a plurality of lateral overflow integrating capacitor (LOFIC) pixels arranged in rows and columns of a pixel array. The plurality of pixels includes an active pixel configured for exposure to light, and a dummy pixel at least partially protected from exposure to light. A common bitline (BL) is couplable to the active pixel and the dummy pixel. A comparator (OA1) is coupled to the bitline. The comparator is configured to receive a pixel voltage (Vx) from the active pixel on one input and a ramp voltage (Vy) on another input. Charge accumulated by the active pixel is determined at least in part by an intersection between the ramp voltage and the pixel voltage.

20 Claims, 12 Drawing Sheets

AUTO-ZERO TECHNIQUES FOR LATERAL OVERFLOW INTEGRATING CAPACITOR (LOFIC) READOUT IMAGE SENSOR

BACKGROUND INFORMATION

Field of Disclosure

This disclosure relates generally to image sensors, and in particular to voltage offset cancellation during data transmission in lateral overflow integrating capacitor (LOFIC) image sensors.

Background

Image sensors have become ubiquitous. They are widely used in digital still cameras, cellular phones, and security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

A typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

Integrated circuit (IC) technologies for image sensors are constantly improving, especially to increase resolution and to lower power consumption. Such improvements frequently involve scaling down device geometries to achieve lower fabrication costs, higher device integration density, higher speeds, and better performance.

High dynamic range (HDR) image sensors are characterized by their capability to store electrical charge for the incoming light in an increased range of intensity. Such HDR image sensors may include LOFICs for additional storage of electrical charge generated by the photodiodes. However, in some scenarios, it may be difficult to precisely read the voltage value of such photodiodes, because of a relatively involved way to reset the voltage value for the photodiodes prior to the voltage readout. Therefore, systems and methods are needed for improved readout of the LOFIC-based image sensors.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
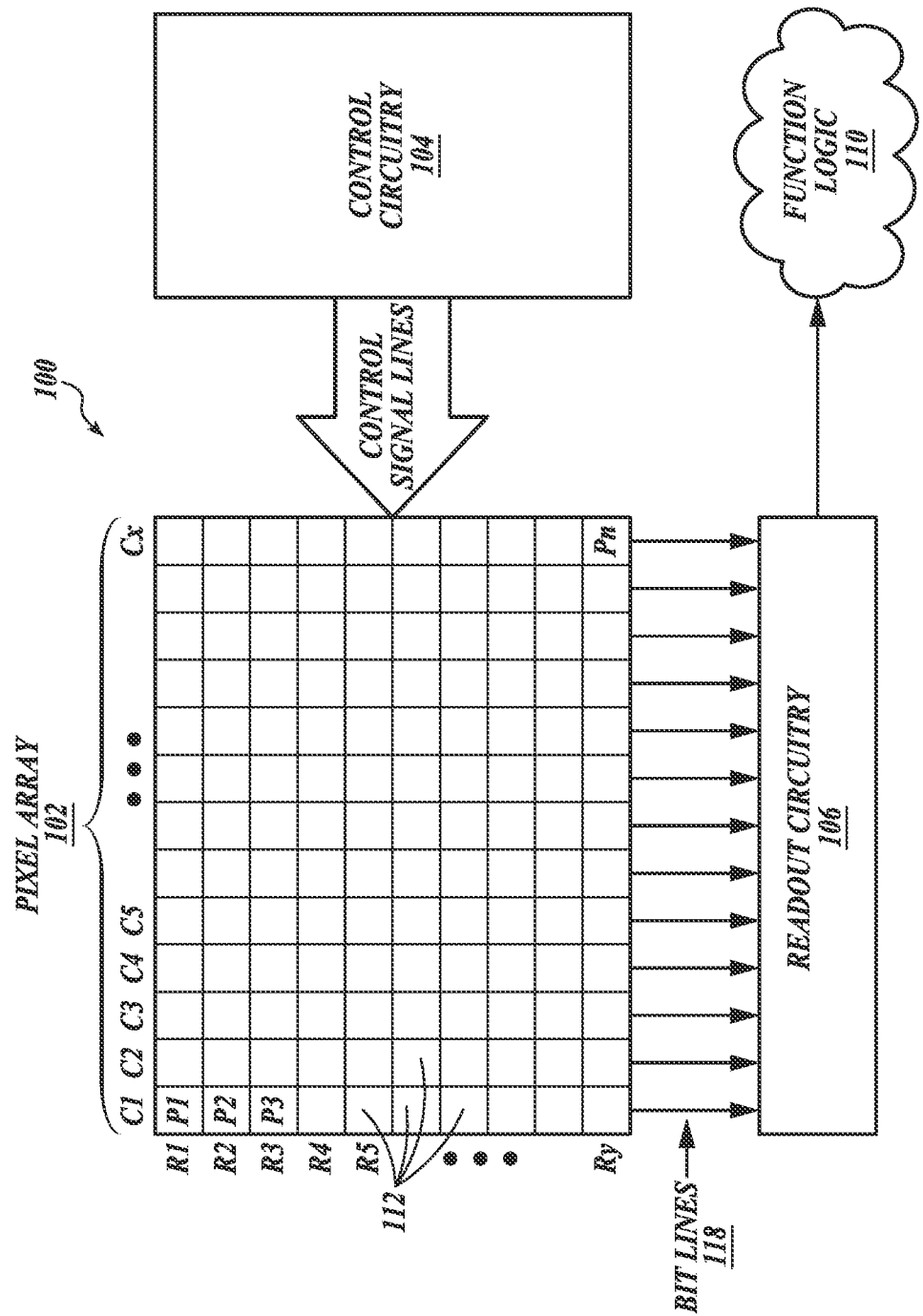
FIG. 1 is an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors having improved photodiode readout, therefore resulting in a more precise analog-to-digital (ADC) conversion of the image sensor's pixel voltages, are disclosed. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, examples in accordance with the teachings of the present technology are directed to sensing and recording voltage values from the photodiodes that may include LOFICs for additional storage of electrical charge generated by the complementary metal oxide semiconductor (CMOS) photodiodes. In some embodiments, a correlated double sampling (CDS) technique is used to read the charge of the photodiode. However, in many LOFIC designs, a reset (RST) signal is executed after the first (signal) readout, therefore raising a pixel voltage Vx to a relatively high voltage value and preventing the subsequent, second comparator flip needed for the CDS technique. With the LOFIC designs, a hypothetical execution of the RST signal before reading the photodiode charge (signal) would drain or at least disturb a charge of the overflow capacitor. Therefore, a commonly used sequential readout of an RST photodiode level followed by a signal (SIG) photodiode level may be impractical for the LOFIC designs, thus necessitating an inversion of a typical four-transistor (4T) order of the CDS readouts. With the LOFIC photodiodes, the reset (RST) signal occurs after the signal readout process has already started, which in turn leads to a comparator voltage (Vy) remaining below the voltage of the photodiode (Vx) throughout the read-out process. As a result, because the intersection of the Vy and Vx (also referred to as comparator flip) does not occur within the allocated time for the ADC, the value of the photodiode's voltage may never be properly recorded.

In some embodiments, dummy pixels are used to improve the readout process. A dummy row of pixels provides a relatively high level of Vy that assures an intersection of the Vx of the photodiode of interest with Vy of the dummy photodiode. A person of ordinary skill would know that dummy pixels are typically characterized by their low exposure to incident light (e.g., dummy pixels are blocked from the light exposure), which causes these pixels to acquire a relatively high voltage that provides an appropriate level of Vy to assure an intersection with the Vx of the active photodiode. However, in some embodiments, dummy pixels and active pixels may produce different voltages even at the nominally same RST level and even at the same bitline, because of, for example, clock feedthrough mismatch, charge injection mismatch, bitline resistance, and source follower (SF) mismatch (especially for an SF of small size, where small difference in size become significant in a relative sense). Such voltage differences that exist after the RST signal ultimately reduce the accuracy of the ADC (also referred to as AD conversion) readout. Therefore, in some embodiments, the RST transistor drains of the dummy and active rows of pixels may be connected to an output of a column-level feedback amplifier that forces the voltage values at the dummy and active bitlines to the same value, thus reducing the voltage offset and improving the accuracy of the ADC readout. In some embodiments, such a column-level feedback amplifier also acts to at least partially reduce the thermal noise (kTC) from the readout, because the thermal noise tends to be similar for the dummy and active photodiodes when used concurrently in the same environment.

FIG. 1 illustrates an example imaging system 100 in accordance with an embodiment of the present disclosure. The imaging system 100 includes pixel array 102, control circuitry 104, readout circuitry 106, and function logic 110. In one example, the pixel array 102 is a two-dimensional (2D) array of photodiodes, or image sensor pixels 112 (e.g., pixels P1, P2 . . . , Pn). As illustrated, the photodiodes are arranged into rows (e.g., rows R1 to Ry) and columns (e.g., column C1 to Cx). In operation, the photodiodes acquire image data of a person, place, object, etc., which can then be used to render a 2D image of the person, place, object, etc. However, the photodiodes do not have to be arranged into rows and columns and may take other configurations.

In an embodiment, after each pixel 112 in pixel array 102 has acquired its image data or image charge, the image data is read out by a readout circuitry 106 via bitlines 118, and then transferred to a function logic 110. In various embodiments, the readout circuitry 106 may include signal amplifiers, analog-to-digital (ADC) conversion circuitry, and data transmission circuitry. The function logic 110 may store the image data or even manipulate the image data by applying post image effects (e.g., crop, rotate, remove red eye, adjust brightness, adjust contrast, or otherwise). In some embodiments, the control circuitry 104 and function logic 110 may be combined into a single functional block to control the capture of images by the pixels 112 and the readout of image data from the readout circuitry 106. The function logic 110 may be a digital processor, for example. In one embodiment, the readout circuitry 106 may readout a row of image data at a time along readout column lines (as illustrated) or may readout the image data using a variety of other techniques (not illustrated), such as a serial readout or a full parallel readout of all pixels simultaneously.

In one embodiment, the control circuitry 104 is coupled to the pixel array 102 to control operation of the plurality of photodiodes in the pixel array 102. For example, the control circuitry 104 may generate a shutter signal for controlling image acquisition. In one embodiment, the shutter signal is a global shutter signal for simultaneously enabling all pixels within pixel array 102 to simultaneously capture their respective image data during a single acquisition window. In another embodiment, the shutter signal is a rolling shutter signal such that each row, column, or group of pixels is sequentially enabled during consecutive acquisition windows. In another embodiment, image acquisition is synchronized with lighting effects such as a flash.

In one embodiment, data transmission circuitry 108 may receive image data from analog-to-digital converters (ADCs), thus converting analog image data into digital representations of the same. The digital representation of the image data is provided to the function logic 110. In some embodiments, the data transmission circuitry 108 may receive the digital representations of the image data from the ADCs in parallel and provide the same to the function logic 110 in series.

In one example, imaging system 100 may be included in a digital camera, cell phone, laptop computer, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2:
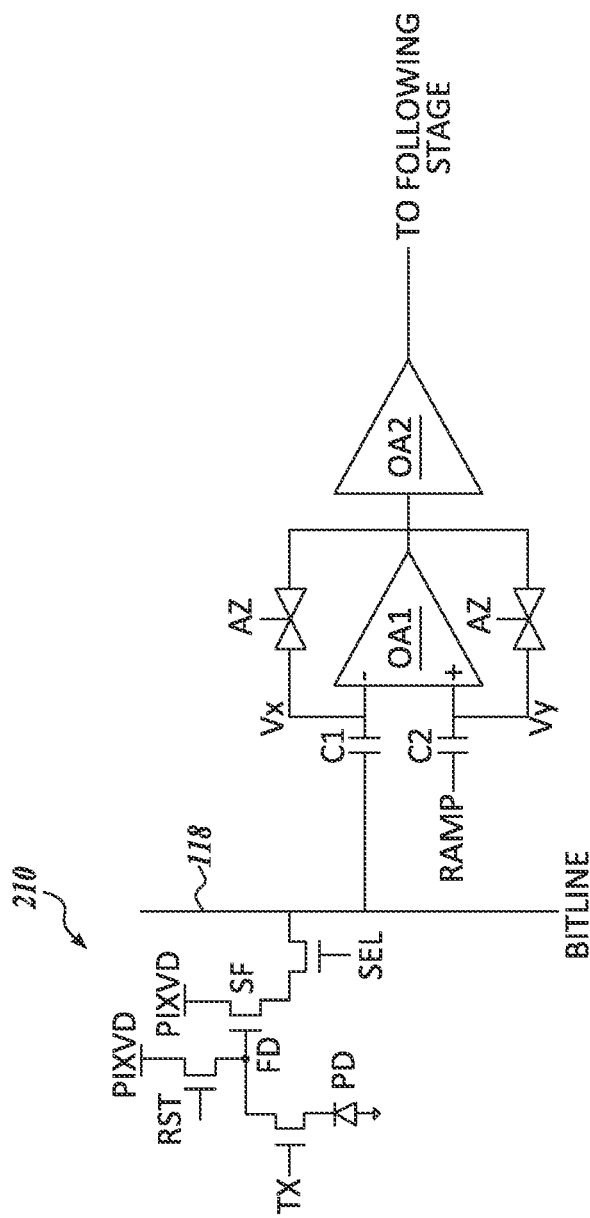
FIG. 2 is a circuit diagram of a sample four transistor (4T) pixel cell in accordance with an embodiment of the present technology.

FIG. 2 is a circuit diagram of a sample four transistor (4T) pixel cell in accordance with an embodiment of the present technology. It is appreciated that pixel cell 210 of FIG. 2 may be an example of a pixel cell 110 of FIG. 1, and that similarly named and numbered elements referenced below may be coupled and function similarly. For example, the pixel cell 210 may be coupled to a bitline 118, e.g., readout column, which may provide image data to readout circuitry, such as the readout circuitry 106. The pixel cell 210 may receive control signals from control circuitry, such as control circuitry 104, to control the operation of the various transistors of the pixel cell 210. The control circuitry may control the operation of the transistors in desired sequences with relative timing in order to reset the pixel to a dark state and to read out image data after an integration, for example.

The illustrated example of the pixel cell 210 includes a photosensitive or photoelectric conversion element, such as a photodiode PD. In operation, the photodiode PD photogenerates an image charge in response to incident light.

Pixel cell 210 also includes a transfer gate TX and floating diffusion FD. In operation, a transfer gate TX transfers image charge from the photodiode PD to the floating diffusion FD in response to a transfer gate signal. A reset transistor RST couples a power supply voltage PIXVD (also referred to as VDD) to the floating diffusion FD to reset the pixel cell 210 (e.g., to discharge or charge the photodiode and the floating diffusion to a preset voltage) in response to a reset signal. The gate terminal of an amplifier transistor SF (also referred to as a source follower) is also coupled to the floating diffusion FD to generate an image data signal in response to the image charge in the floating diffusion FD. A row select transistor SEL (also referred to as RS) is coupled to the source follower SF to output the image data signal to an output bitline 118.

The image data signal is further routed to a capacitor C1 of a comparator (e.g., an operational amp) OA1. The voltage that the comparator OA1 senses at this input is Vx. The other input of the comparator OA1 is a ramp voltage Vy. In operation, the comparator OA1 is first self-reset (auto-zero or AZ) at the RST level of the pixel PD through corresponding transmission gates, which are auto-zero switches that switch in response to the AZ signal. The switches reset the input and output of OA1 to the same voltage. Subsequently, an AD conversion is conducted to digitize the pixel RST voltage. Afterwards, transfer gate TX is turned-on, allowing the electrons accumulated in the photodiode PD to be transferred out onto the floating diffusion FD node. Then another AD conversion is conducted to digitize the pixel's signal voltage level, using a voltage ramp that is further described below. The digitized signal can next be transferred to a following stage of the readout circuit.

Figure 3:
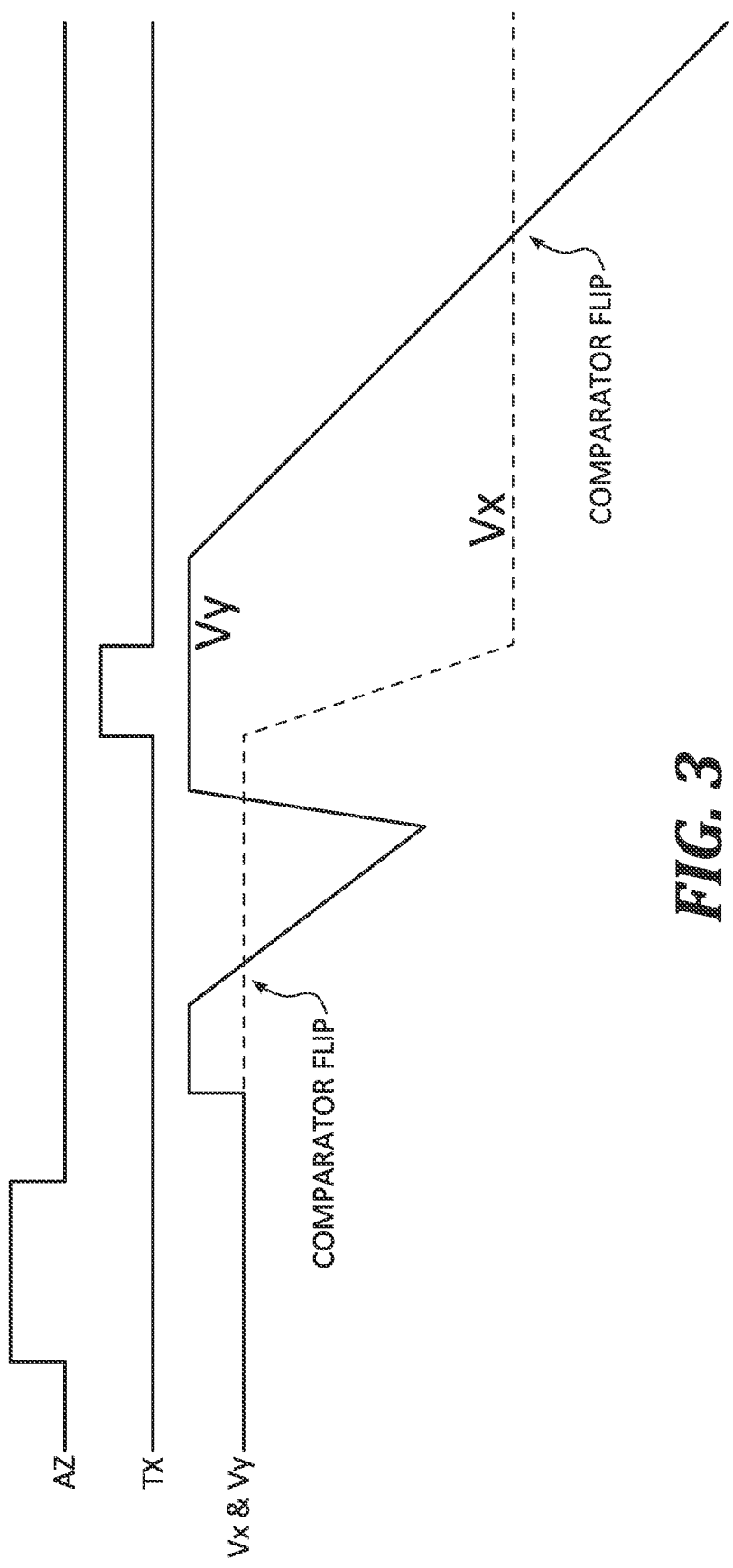
FIG. 3 is an example timing diagram for the sample pixel cell of FIG. 2.

FIG. 3 is an example timing diagram for the sample pixel cell of FIG. 2. Four signals are shown: auto-zero (AZ), transfer (TX), Vy (ramp voltage) and Vx (pixel voltage). In operation, the comparator is first self-reset (auto-zero or AZ) at the RST level of the pixel. In the illustrated embodiment, one AD conversion is conducted to digitize the pixel RST voltage (the first "comparator flip" on the timing diagram). Afterwards, the transfer gate TX is turned-on, allowing the electrons accumulated in the photodiode to be transferred out to the floating diffusion (FD) node. As the electrons accumulate at the FD node, Vx is brought down to its steady value, and AD conversion may start by lowering Vy till the two voltages intersect (second "comparator flip" in the timing diagram). These two AD conversions constitute a correlated double sampling (CDS) technique. At this point, the pixel's signal voltage level is determined, and may be further processed by, for example, readout circuitry 106 or function logic 110.

Figure 4:
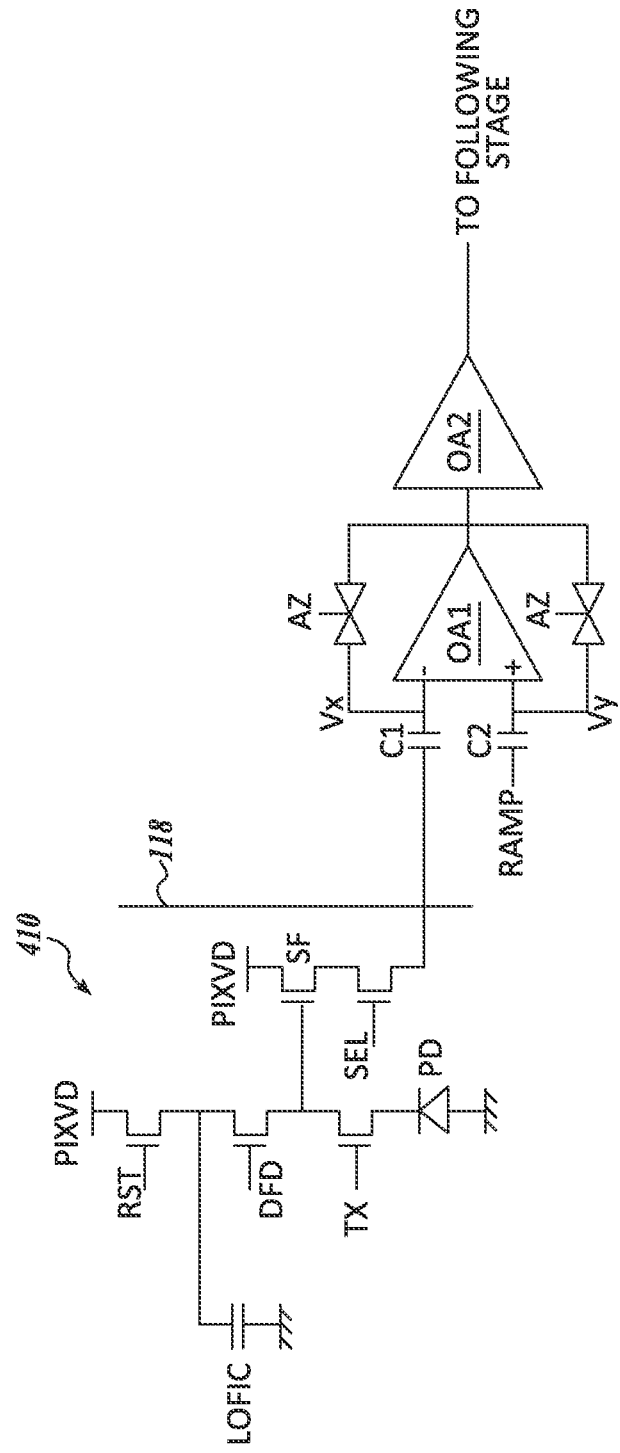
FIG. 4 is a circuit diagram of a sample LOFIC pixel cell in accordance with an embodiment of the present technology.

FIG. 4 is a circuit diagram of a sample LOFIC pixel cell in accordance with an embodiment of the present technology. For brevity and simplicity, those parts of FIG. 4 that are already described with respect to FIG. 2 are not described again. Illustrated pixel circuit 410 includes a photodiode PD and an overflow capacitor LOFIC. In the depicted example, the overflow capacitor is a lateral overflow integration capacitor and is labeled "LOFIC" in the examples depicted in the drawings. In various examples, the overflow capacitor may be implemented with a metal-insulator-metal (MIM), a metal oxide semiconductor capacitor (MOSCAP), or another suitable overflow capacitor structure. As shown in the depicted example, the overflow capacitor LOFIC has a first terminal that is coupled to ground and a second terminal that is coupled to receive overflow charge coming from the photodiode PD through the transfer gate TX and a dual floating diffusion gate DFD. In different embodiments, the first terminal of the LOFIC may be coupled to a predetermined voltage instead of ground. The capacitance of the LOFIC provides an additional storage for the electrical charge generated by the photodiode PD. As a result, the dynamic range of the pixel 410 is increased, meaning that the pixel 410 can capture higher intensities of the incoming light and/or can do so over a longer period of time. However, a reset signal executed through the reset gate RST would necessarily discharge the charge accumulated by the LOFIC. Therefore, a signal sequence described with reference to FIG. 3 that works adequately with the 4T pixel circuit illustrated in FIG. 2, causes readout issues described with reference to FIG. 5 and FIG. 6 below.

Figure 5:
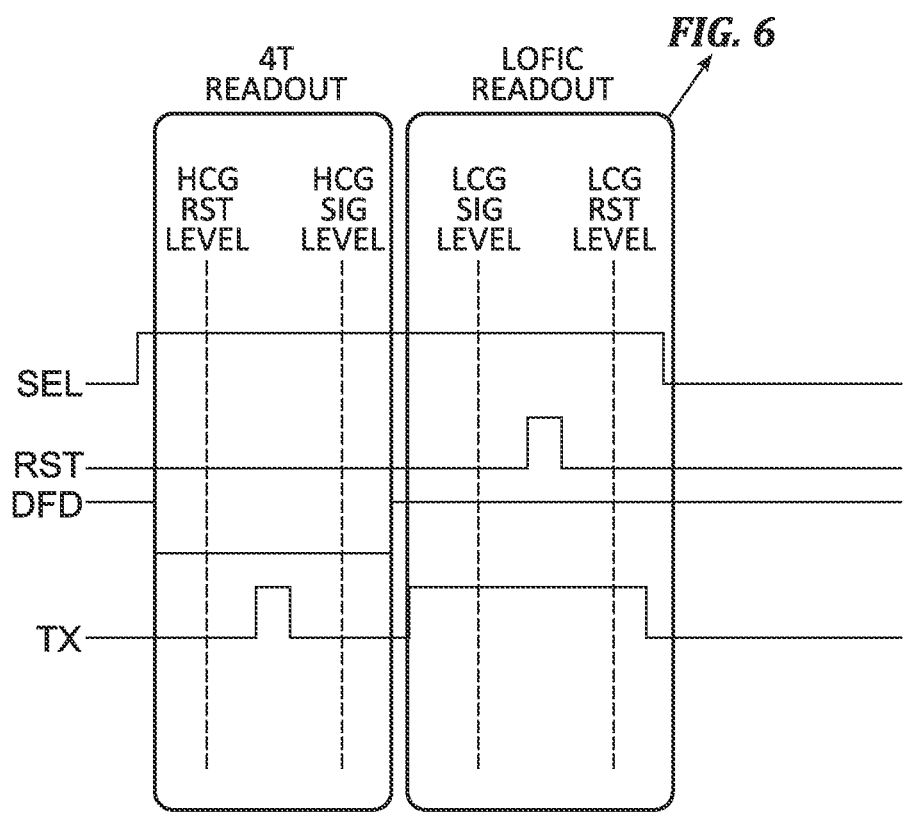
FIG. 5 is a comparison timing diagram of a 4T pixel cell and a LOFIC pixel cell in accordance with embodiments of the present technology.

FIG. 5 is a comparison timing diagram of a 4T pixel cell and a LOFIC pixel cell in accordance with embodiments of the present technology. The left-hand side of the graph corresponds to the 4T readout, where the pixel cell may be referred to as the high conversion gain (HCG) pixel cell. The right-hand side of the graph corresponds to the LOFIC readout, where the pixel cell may be referred to as the low conversion gain (LCG) pixel cell.

For the 4T readout, the RST signal has already been executed prior to the vertical line marking a high conversion gain (HCG) RST level. The TX signals occurs between the high HCG RST level and the HCG signal (SIG) level. After the TX signal, the photodiode charge is ready for the readout. However, for the LOFIC readout, executing the RST after the DFD and TX signal, but prior to the second comparator flip, raises the Vx to a relatively high voltage.

Such a sequence of signals may prevent a comparator flip, as described with reference to FIG. 6 below.

Figure 6:
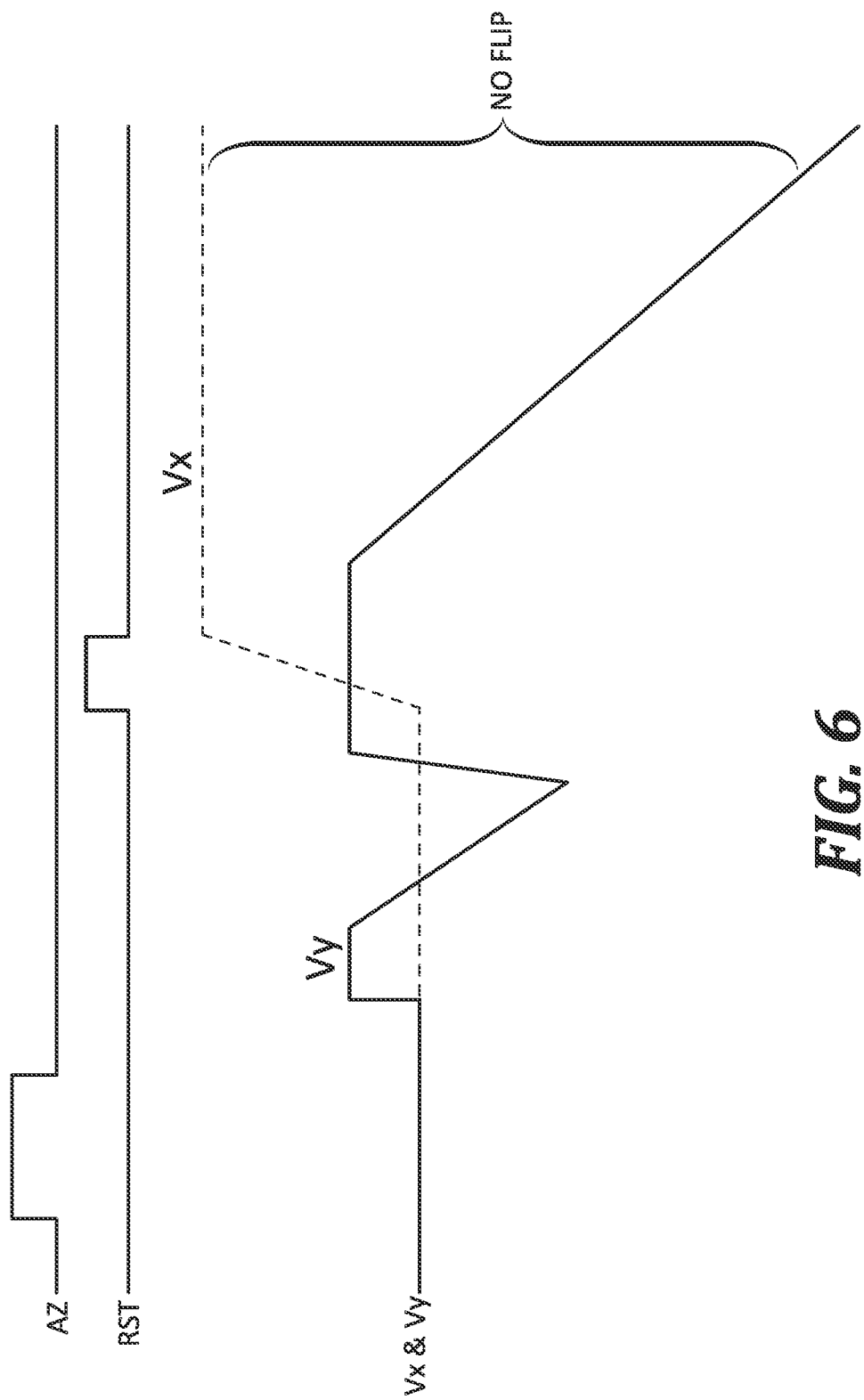
FIG. 6 is an example timing diagram for the sample pixel cell of FIG. 4.

FIG. 6 is an example LOFIC timing diagram for the sample pixel cell of FIG. 4. During the comparator autozero (AZ) phase, the comparator is reset at the signal (SIG) level of the LOFIC pixel and the first AD conversion occurs after the reset (RST) signal. However, because the RST voltage level is almost always higher that SIG voltage level, the input of the comparator, shown as Vx, jumps up. Therefore, after the RST signal, the Vx is set to a high value (e.g., close to VDD). Since Vx is now higher than Vy, Vx cannot intersect with Vy for a ramp-down comparator. As a result, a second comparator flip event does not occur, and the CDS value of the charge generated by the photodiode cannot be determined, resulting in a failure of the AD conversion. In some embodiments, the comparator may be able to ramp both down and up, therefore being capable of generating the second comparator flip event, but such comparators typically require more circuit resources (area, power consumption, etc.) and additional design efforts.

Figure 7:
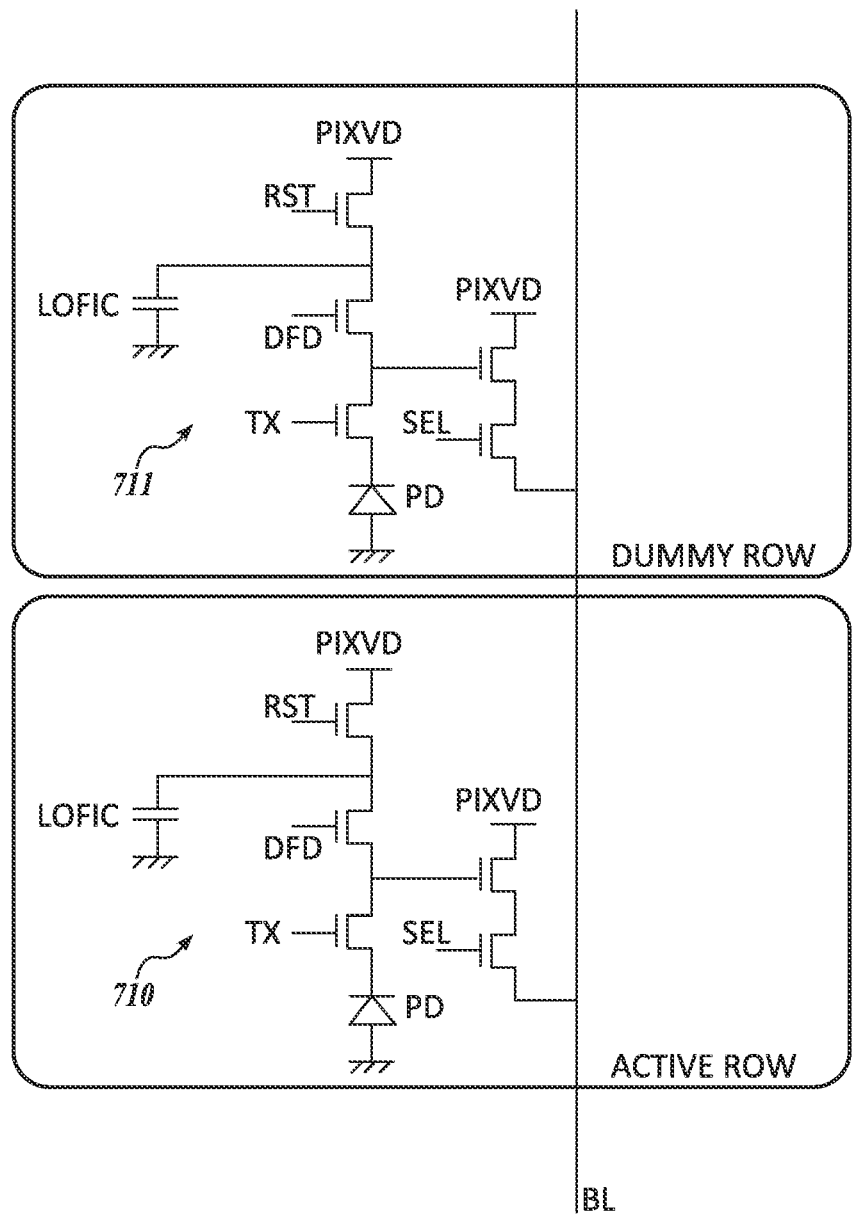
FIG. 7 is a circuit diagram of sample LOFIC pixel cells in accordance with an embodiment of the present technology.

FIG. 7 is a circuit diagram of sample LOFIC pixel cells in accordance with an embodiment of the present technology. In some embodiments, the dummy rows are located between the active sensing area and the optical black (OB) area, which serve as an isolation area and do not contribute to the image readout. A special treatment is applied to dummy pixels to reduce light sensitivity. In some embodiments, electrical circuitry of a pixel in the dummy row is identical to that of a pixel in the active row, and the RST voltage of a dummy pixel is the same or close to that of a pixel in the active row. Therefore, the RST signal executed on a dummy pixel 711 serves to establish the comparator autozero (AZ). After the comparator autozero phase, the common bitline (BL) may be coupled back to an active pixel 710 by the SEL signal, and the signal voltage level Vx is digitized. The timing of the above process is described with respect to FIGS. 8 and 9 below.

Figure 8:
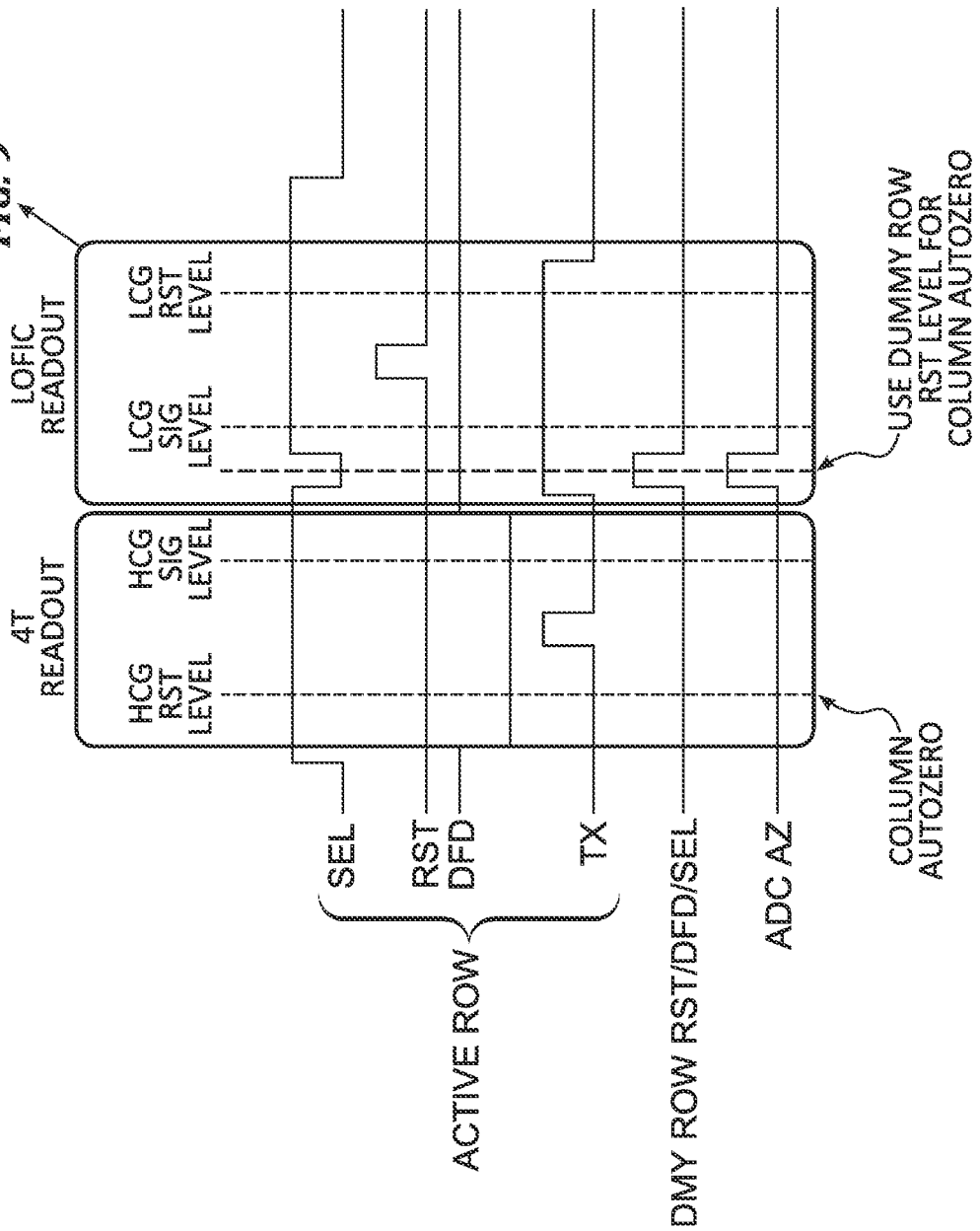
FIG. 8 is a comparison timing diagram of an active and dummy row of pixel cells in accordance with embodiments of the present technology.
Figure 9:
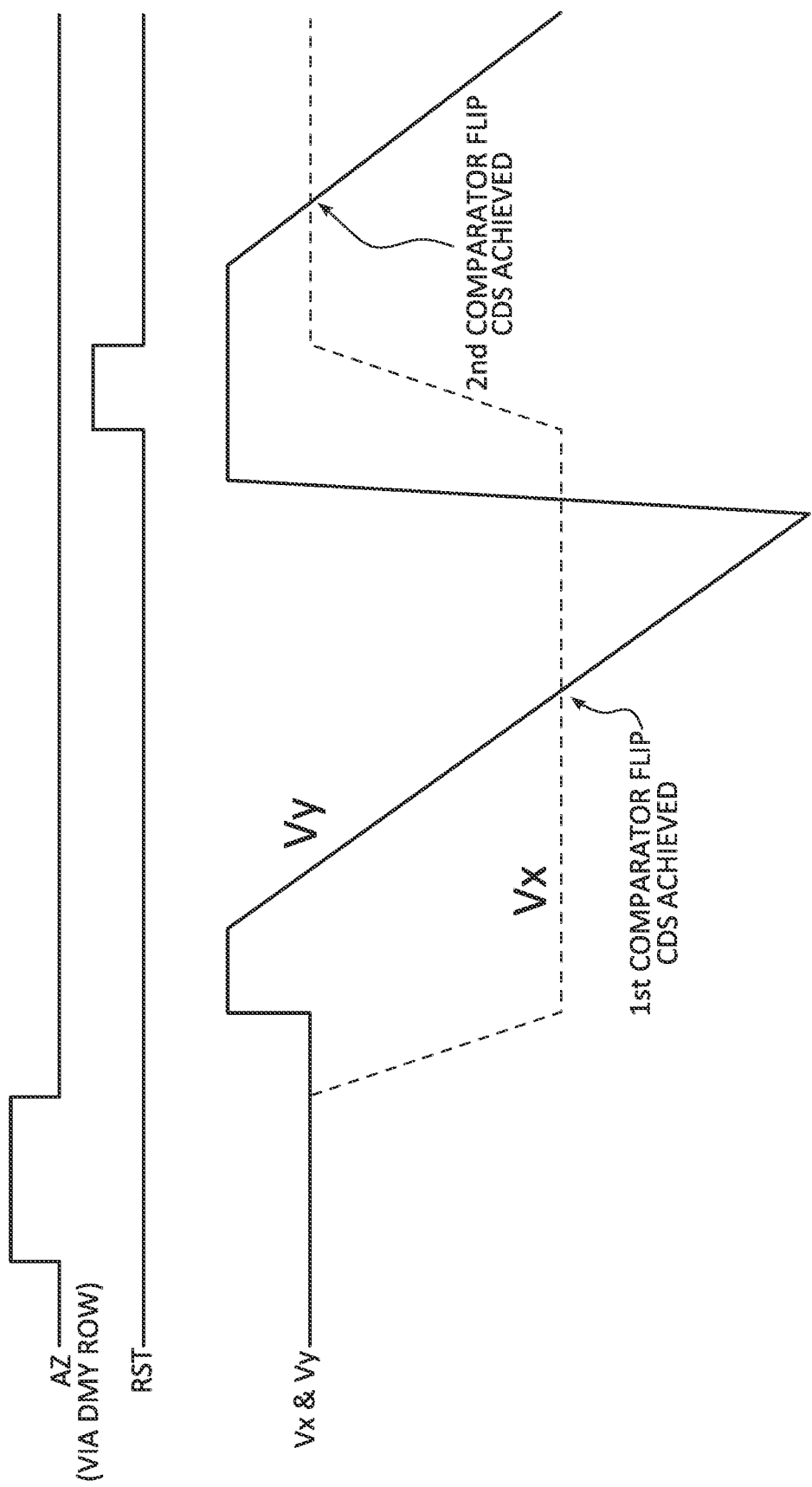
FIG. 9 is an example timing diagram of a sample LOFIC pixel cell in accordance with an embodiment of the present technology.

FIG. 8 is a comparison timing diagram of an active and dummy row of pixel cells in accordance with embodiments of the present technology. FIG. 9 is an example timing diagram of a sample LOFIC pixel cell in accordance with an embodiment of the present technology. In operation, the SEL signal of the dummy pixel is high when the SEL signal of the active pixel is low, therefore the concurrent RST signal applies to the dummy pixel only at that time. The RST signal executed on the dummy pixel sets a reference point for column autozero (AZ), therefore setting Vy to a relatively high value corresponding to the dummy pixel. After a designated active pixel is selected by the SEL signal, the signal level Vx of the active pixel is determined through a first comparator flip shown in FIG. 9. Subsequently, the RST signal is executed on the active pixel, resulting in an increase of the Vx. However, since Vy is relatively high (based on the dummy pixel), the second comparator flip can still be obtained, therefore completing the CDS process.

Figure 10:
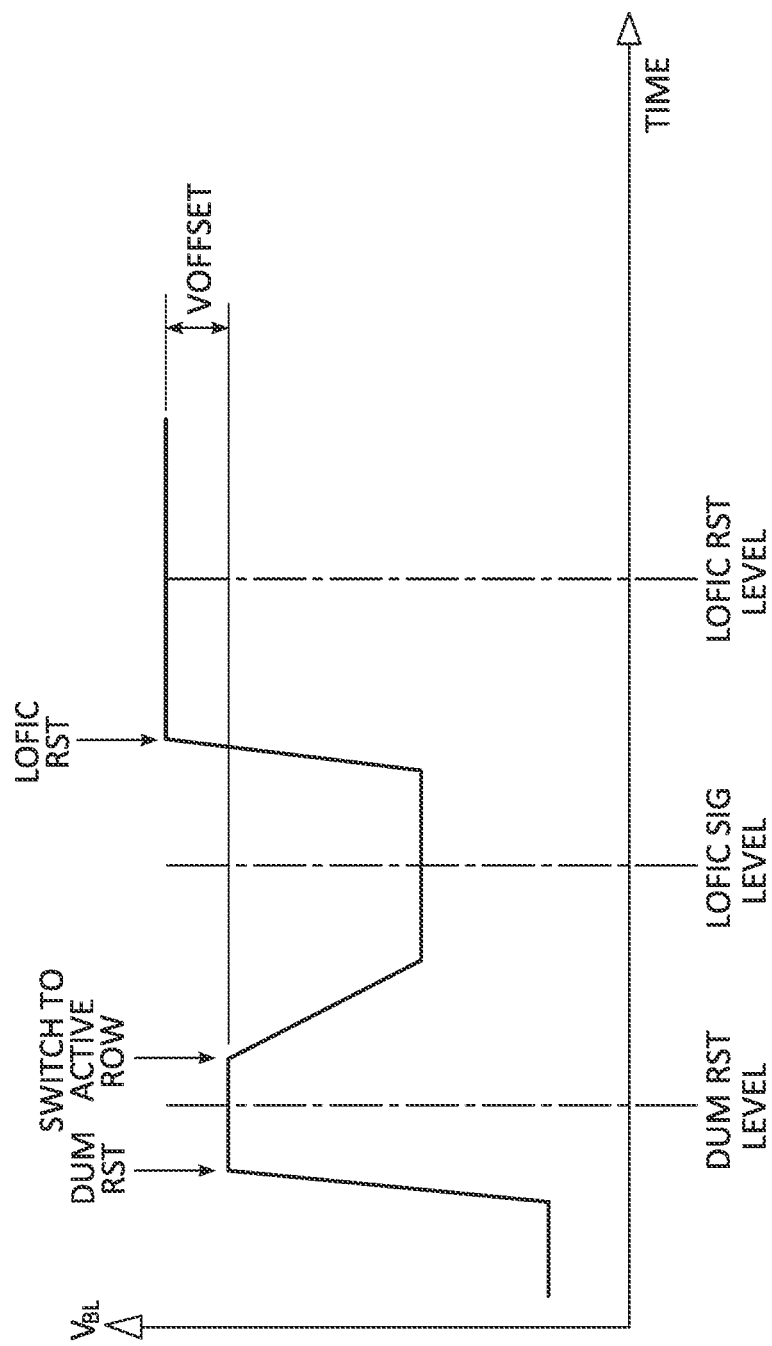
FIG. 10 is a voltage offset graph of a sample LOFIC pixel cell in accordance with an embodiment of the present technology.

FIG. 10 is a voltage offset graph of a sample LOFIC pixel cell in accordance with an embodiment of the present technology. The horizontal axis indicates time, and the vertical axis indicates voltage at the bitline (VBL). Vertical phantom lines indicate respective times when the voltage at the bitline corresponds to dummy RST level, LOFIC signal level, and LOFIC RST level, respectively.

In operation of the dummy pixel, after the RST signal, the voltage drop from the PIXVD to the bitline is ΔVD. Similarly, the voltage drop from the PIXVD to the bitline is ΔVA for the active pixel. Therefore, at the bitline, a dummy pixel may have voltage PIXVD-ΔVD, and an active pixel may have voltage PIXVD-ΔVA. In different embodiments, this voltage difference (ΔVD−ΔVA) may result from clock feed-through mismatch, charge injection mismatch, bitline resistance, and source follower (SF) mismatch. Therefore, voltage at the bitline for the dummy pixel after the RST signal (DUM RST in the graph) may be different from the voltage for the active pixel after the RST signal (LOFIC RST in the graph). This difference in voltages (VOFFSET) affects the accuracy of the AD conversion and may, in some cases, cause a failure of the AD conversion.

Figure 11:
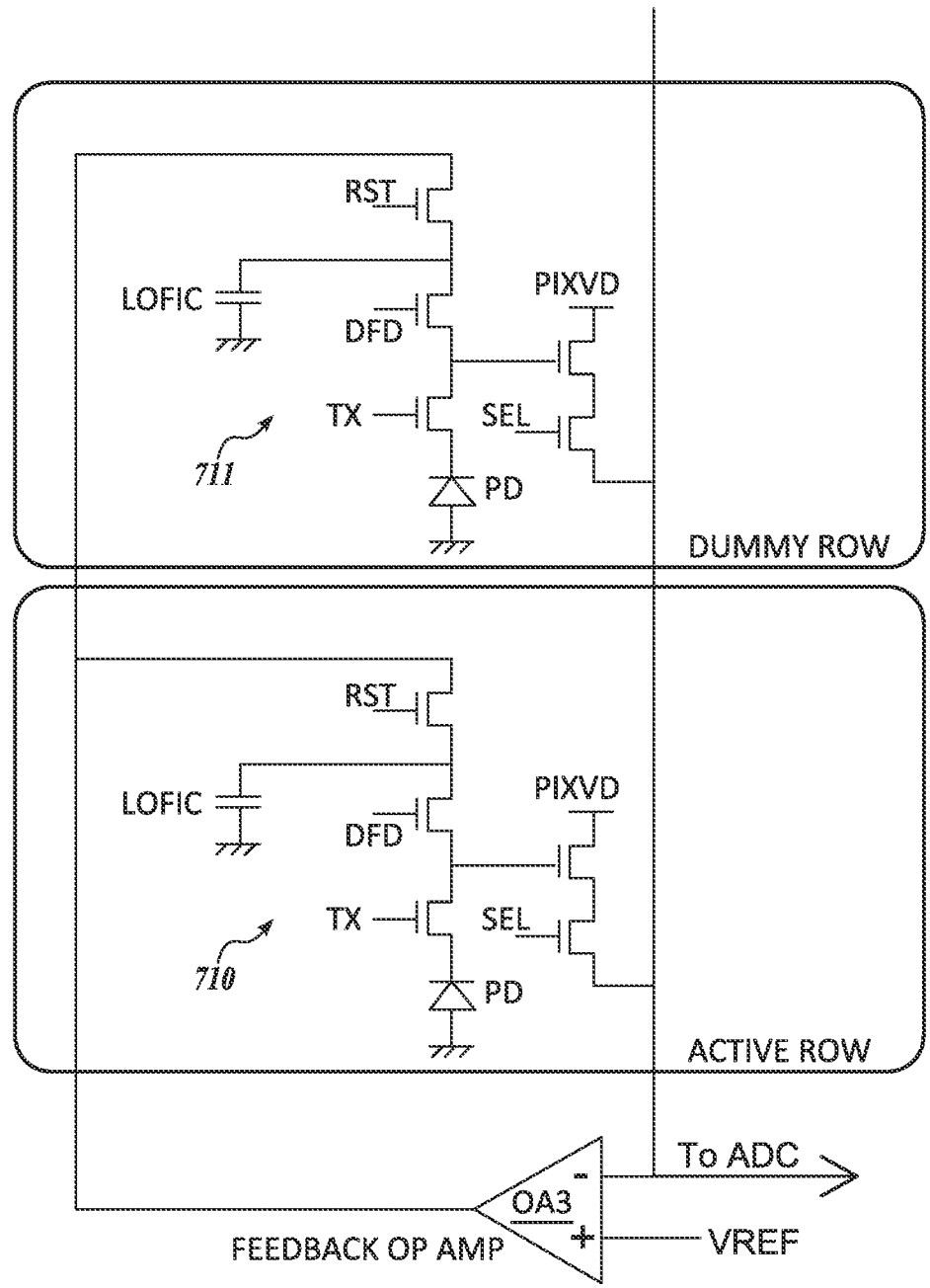
FIG. 11 is a circuit diagram of a sample LOFIC pixel cell in accordance with an embodiment of the present technology.

FIG. 11 is a circuit diagram of a sample LOFIC pixel cell in accordance with an embodiment of the present technology. Illustrated circuit diagram is analogous to the one shown in FIG. 7, except that a feedback operational amplifier OA3 is added to the circuit. In the illustrated embodiment, the operational amplifier OA3 acts as an amplifier to amplify the difference and feed it back to the drain of the RST by having a non-inverting input VREF and an inverting input that is coupled to AD conversion circuitry (e.g., operational amplifier OA1, not shown here). The operational amplifier OA3 acts to force drain voltages at drain terminals of the reset transistor RST to make sure that the source follower outputs align with VREF. Therefore, the difference in voltages (VOFFSET) is eliminated or at least reduced, thus reducing or eliminating the above-described issues created by VOFFSET. The resulting voltages provided to the AD conversion are shown in the graph of FIG. 12.

Figure 12:
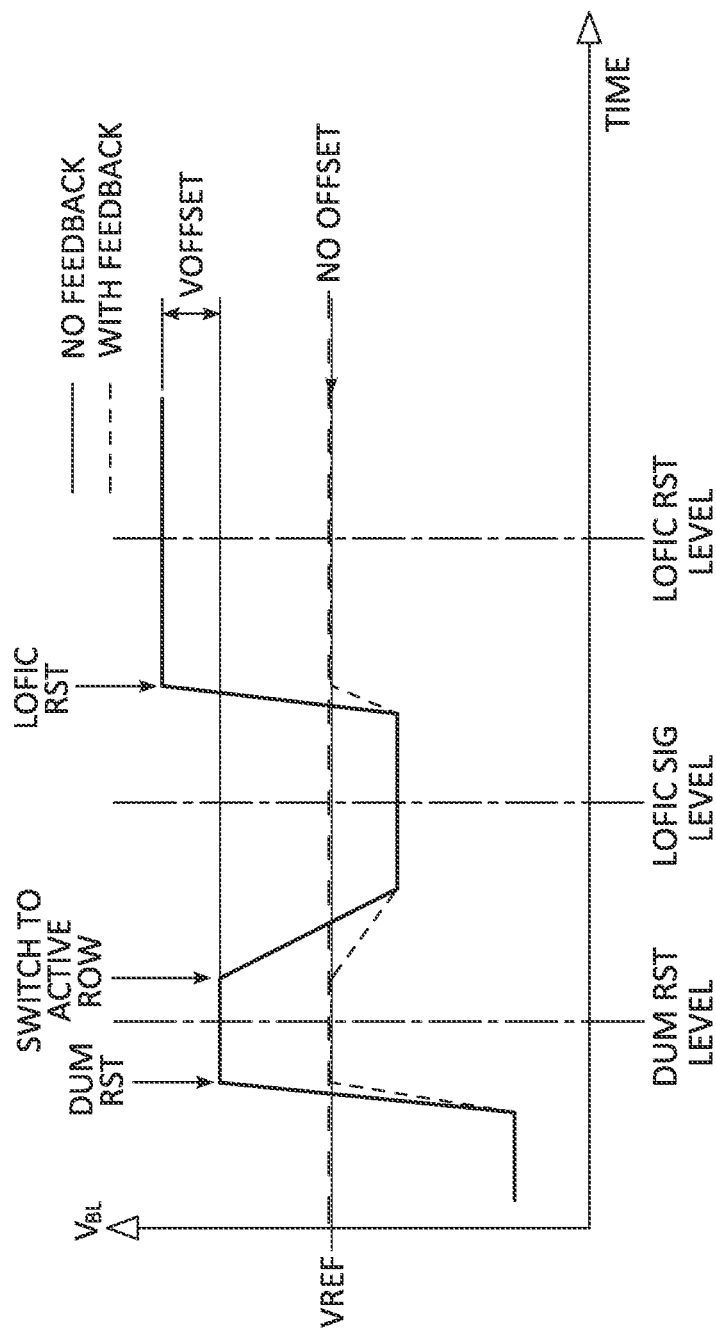
FIG. 12 is a voltage offset graph of a sample LOFIC pixel cell in accordance with an embodiment of the present technology.

FIG. 12 is a voltage offset graph of a sample LOFIC pixel cell in accordance with an embodiment of the present technology. The horizontal axis indicates time, and the vertical axis indicates voltage at the bitline (VBL). Dash lines indicate the voltages when the feedback operational amplifier OA3 is included in the circuit. Due to the feedback operational amplifier OA3, the RST levels are forced to the same VREF value for both the dummy and active pixels. Therefore, the VOFFSET illustrated with solid lines in the "no feedback" scenario, is significantly reduced.

Additionally, a side benefit of the feedback loop is that the thermal noise (also referred to as "kTC noise") is reduced by the active feedback scheme due to LOFIC's pseudo correlated double sampling (non-CDS) operation. Generally, for the "SIG first, RST later" readout that results in uncorrelated noise samples, the thermal noise cannot be cancelled by the correlated double sampling (CDS) technique. Canceling the thermal noise with the feedback loop may further improve noise performance of LOFIC readout.

Many embodiments of the technology described above may take the form of a computer or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured, or constructed to perform one or more of the computer-executable instructions described above. Of course, any logic or algorithm described herein can be implemented in software or hardware or a combination of software and hardware.

The above description of illustrated examples of the invention, including what is described in the Abstract is not intended to be exhaustive or to limit the invention to the precise forms disclosed. As used herein, the term "about" indicates that the subject value can be modified by plus or minus 5% and still fall within the disclosed embodiment. While specific examples of the invention are described herein for illustrative purposes, various modifications are possible within the scope of the invention, as those skilled in the relevant art will recognize. These modifications can be made to the invention in light of the above detailed description. The terms used in the following claims should not be constructed to limit the invention to the specific examples disclosed in the specification, Rather the scope of the invention is to be determined entirely by the following claims, which are to be construed in accordance with established doctrines of claim interpretation.

What is claimed is:

1. An image sensor, comprising:
   a plurality of lateral overflow integrating capacitor (LOFIC) pixels arranged in rows and columns of a pixel array, wherein the plurality of pixels includes:
      an active pixel configured for exposure to light, and
      a dummy pixel at least partially protected from exposure to light;
   a common bitline (BL) couplable to the active pixel and the dummy pixel; and
   a comparator (OA1) coupled to the bitline,
   wherein the comparator is configured for receiving a pixel voltage (Vx) from the active pixel on one input and a ramp voltage (Vy) on another input, and wherein a charge accumulated by the active pixel is determined at least in part by an intersection between the ramp voltage and the pixel voltage.

2. The image sensor of claim 1, further comprising a feedback operational amplifier (OA3) having:
   a first input coupled to a reference voltage (VREF);
   a second input coupled to the bitline; and
   an output coupled to drain terminals of respective reset transistors (RSTs) of the dummy pixel and the active pixel.

3. The image sensor of claim 2, wherein the first input is a non-inverting input, and the second input is an inverting input.

4. The image sensor of claim 2, wherein the second input is coupled to the comparator.

5. The image sensor of claim 2, wherein the comparator is configured to detect a first comparator flip indicating the charge accumulated by the active pixel, and a second comparator flip indicating a voltage of the active pixel after a reset signal.

6. The image sensor of claim 5, wherein the first comparator flip and the second comparator flip collectively comprise a correlated double sampling (CDS) value of the charge of the active pixel.

7. The image sensor of claim 2, wherein the dummy pixel is reset first to provide a dummy reset voltage at the second input of the feedback operational amplifier, and the active pixel is reset second to provide an active reset voltage at the second input of the feedback operational amplifier.

8. The image sensor of claim 7, wherein a difference between the dummy reset voltage at the second input of the feedback operational amplifier, and the active reset voltage at the second input of the feedback operational amplifier is within a sub-mV range.

9. A method of a correlated double sampling (CDS) readout of an image sensor having a plurality of lateral overflow integrating capacitor (LOFIC) pixels of a pixel array, the method comprising:
   exposing an active pixel to light, and
   at least partially protecting a dummy pixel from exposure to light;
   providing a first reset signal to a reset transistor (RST) of the dummy pixel, wherein the dummy pixel and the active pixel are couplable to a common bitline (BL) through their corresponding select transistors (SELs);
   coupling the active pixel to the common bitline through its select transistor (SEL); and
   determining a first comparator flip by finding an intersection between a ramp voltage (Vy) and a pixel voltage (Vx) from the active pixel.

10. The method of claim 9, further comprising:
    providing a second reset signal to a reset transistor (RST) of the active pixel; and
    determining a second comparator flip by finding an intersection between the ramp voltage (Vy) and a pixel voltage (Vx) from the active pixel after the second reset signal.

11. The method of claim 10, further comprising:
    after providing the first reset signal to the reset transistor (RST) of the dummy pixel, decoupling the dummy pixel from the common bitline through its select transistor (SEL).

12. The method of claim 11, wherein coupling the active pixel to the common bitline through its select transistor (SEL) is executed after decoupling the dummy pixel from the common bitline through its select transistor (SEL).

13. The method of claim 9, wherein the image sensor further comprises a feedback operational amplifier (OA3), the method further comprising:
    coupling a reference voltage (VREF) to a first input of the feedback operational amplifier (OA3);
    coupling a bitline voltage to a second input of the feedback operational amplifier (OA3); and
    coupling an output of the feedback operational amplifier (OA3) to drain terminals of respective reset transistors (RSTs) of the dummy pixel and the active pixel.

14. The method of claim 13, further comprising:
    coupling the second input of the feedback operational amplifier (OA3) to an input of a comparator (OA1).

15. The method of claim 13, wherein the first input is a non-inverting input, and the second input is an inverting input.

16. The method of claim 13, wherein the second input is coupled to the comparator (OA1).

17. The method of claim 12, wherein coupling an output of the feedback operational amplifier (OA3) to drain terminals of respective reset transistors (RSTs) of the dummy pixel and of the active pixel forces voltage of the bitline to be the reference voltage (VREF).

18. The method of claim 12, wherein the first reset signal to the dummy pixel generates a dummy reset voltage at the bitline, and wherein the second reset signal to the active pixel generates an active reset voltage at the bitline, and wherein a difference between the dummy reset voltage, and the active reset voltage is within a sub-mV range.

19. The method of claim 12, wherein the reference voltage (VREF) is lower than the bitline voltage without the feedback operational amplifier (OA3).

20. The method of claim 12, wherein the comparator (OA1) is a ramp-down comparator.

* * * * *